(12) United States Patent
Doyle et al.

(10) Patent No.: US 6,664,173 B2
(45) Date of Patent: Dec. 16, 2003

(54) HARDMASK GATE PATTERNING TECHNIQUE FOR ALL TRANSISTORS USING SPACER GATE APPROACH FOR CRITICAL DIMENSION CONTROL

(75) Inventors: Brian Doyle, Portland, OR (US); Mark Doczy, Beaverton, OR (US); Pat Stokley, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 10/044,443

(22) Filed: Jan. 9, 2002

(65) Prior Publication Data

US 2003/0129815 A1 Jul. 10, 2003

(51) Int. Cl.[7] .......................................... H01L 21/3205
(52) U.S. Cl. ........................ 438/587; 438/947; 438/950
(58) Field of Search ................................ 438/585, 587, 438/588, 947, 950

(56) References Cited

U.S. PATENT DOCUMENTS

| | | | | |
|---|---|---|---|---|
| 5,942,787 A | * | 8/1999 | Gardner et al. | 257/408 |
| 6,022,815 A | | 2/2000 | Doyle et al. | 438/947 |
| 6,110,837 A | * | 8/2000 | Linliu et al. | 438/723 |
| 6,391,753 B1 | * | 5/2002 | Yu | 438/587 |
| 2001/0001725 A1 | * | 5/2001 | Cheng et al. | 438/595 |
| 2003/0077899 A1 | * | 4/2003 | Deleonibus | 438/671 |

OTHER PUBLICATIONS

Fiegna et al., "Scaling the MOS Transistor Below 0.1 um: Methodology, Device Structures, and Technology Requirements", IEEE Transactions on Electron Devices vol. 41 No. 6 Jun. 1994, pp. 941–951.

J. Horstmann et al., "Characterisation of Sub–100 nm–MOS–Transistors Processed by Optical Lithography and a Sidewall–Etchback Technique", Microelectronic Engineering vol. 30 1996, pp. 431–434.

Kimura et al., "Short–Channel–Effect–Supressed Sub–0.1–um Grooved–Gate MOSFET's with W Gate", IEEE Transactions on Electron Devices vol. 42 No. 1 Jan. 1995, pp. 94–100.

* cited by examiner

Primary Examiner—Trung Dang
(74) Attorney, Agent, or Firm—Fish & Richardson P.C.

(57) ABSTRACT

An electrical element may be made by providing a hardmask unit that has a double gate stack with a first gate layer, a first hardmask layer formed over the first gate layer, a second gate layer formed over the first hardmask layer, and a second hardmask layer formed over the second gate layer. A first spacer for a first element is formed at a location at least partially determined by the presence of the second hardmask layer, and a second structure for a second element is formed at a location at least partially determined by the presence of the first hardmask layer.

44 Claims, 7 Drawing Sheets

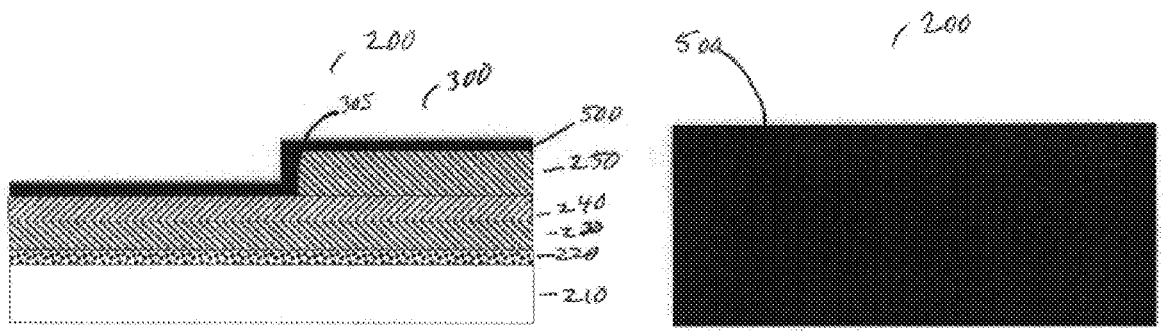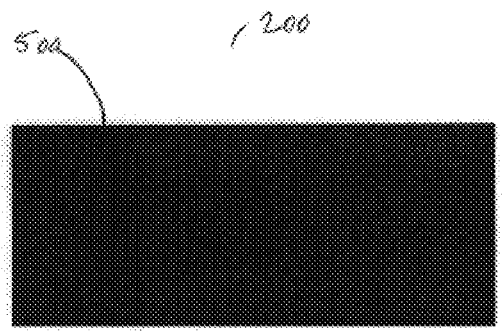
Figure 5a. Figure 5b.
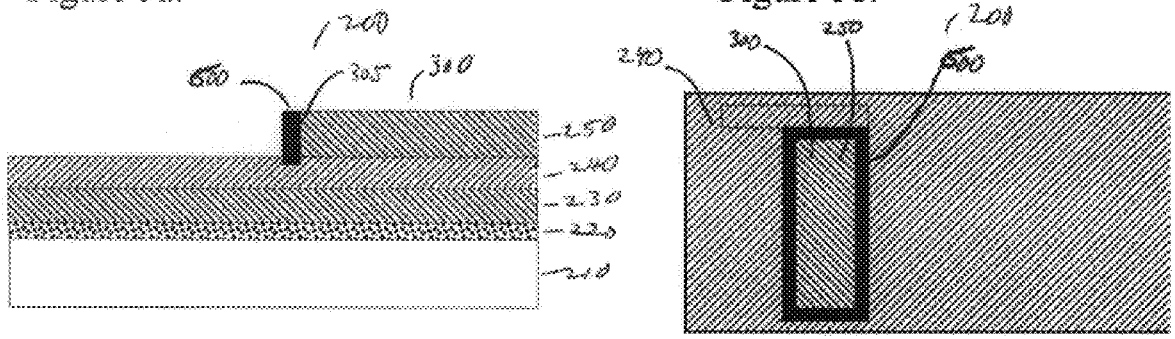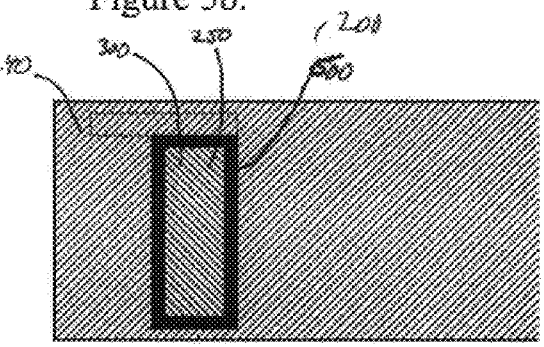
Figure 6a. Figure 6b.
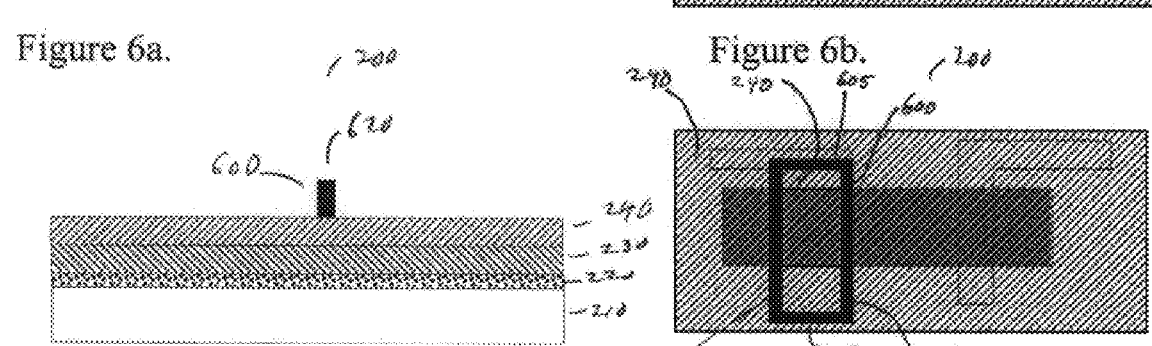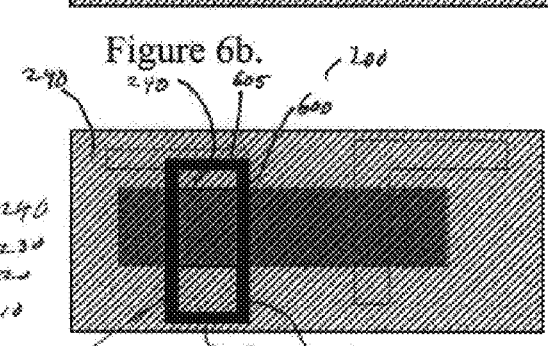
Figure 7a. Figure 7b.
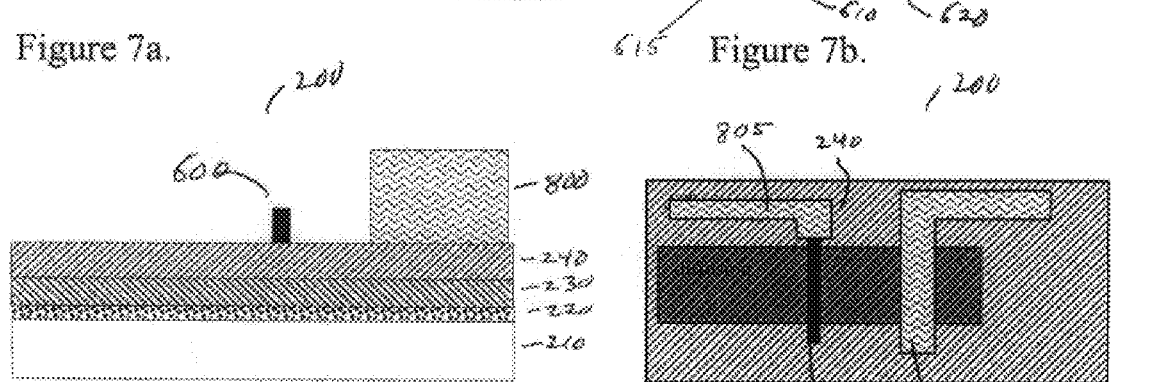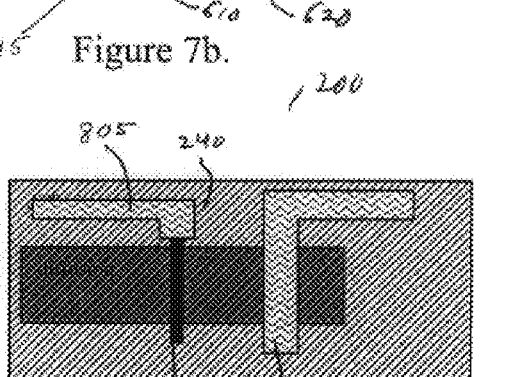
Figure 8a. Figure 8b.

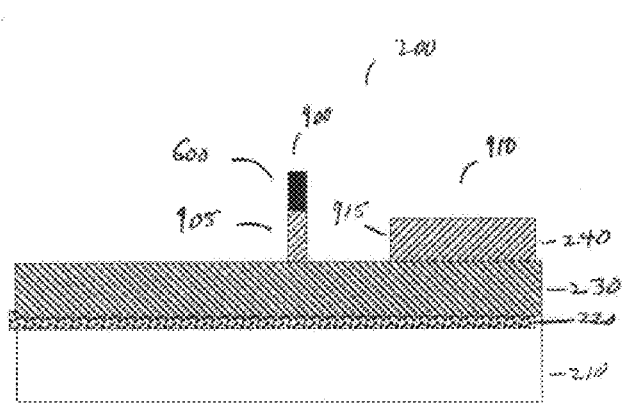
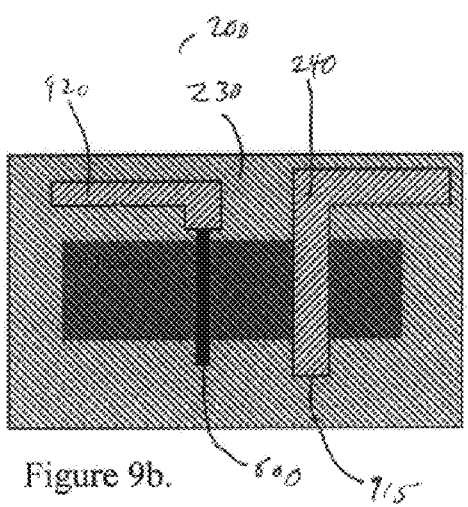
Figure 9a.
Figure 9b.
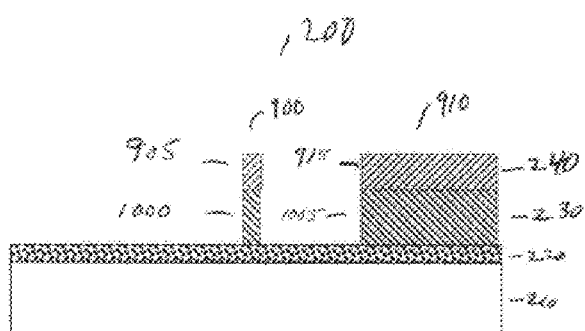
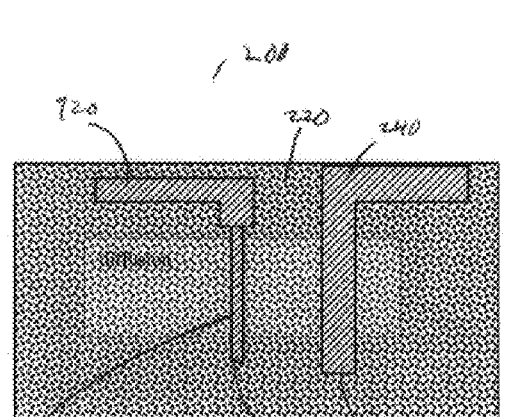
Figure 10a.
Figure 10b.
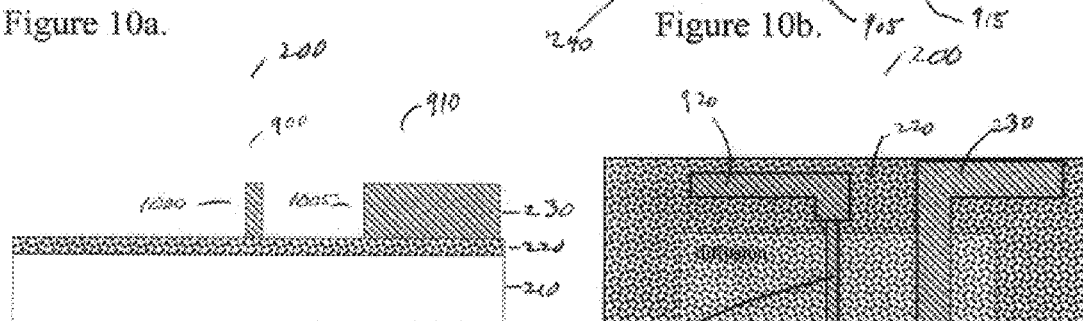
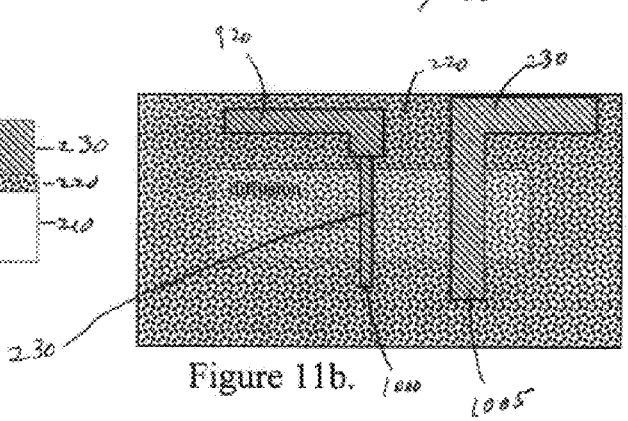
Figure 11a.
Figure 11b.

HARDMASK GATE PATTERNING TECHNIQUE FOR ALL TRANSISTORS USING SPACER GATE APPROACH FOR CRITICAL DIMENSION CONTROL

TECHNICAL FIELD

This invention relates to semiconductor processing and semiconductor elements.

BACKGROUND

In the production of semiconductor devices, particularly MOS or CMOS devices, a layer of gate material such as polysilicon typically is etched to form a transistor gate structure. As one aspect of forming the gate, the length of the gate, called the "critical dimension" or "CD," should be closely controlled. Often, it is desirable to use a "minimum-size" device with the smallest achievable critical dimension. With photolithography, the size of the critical dimension is limited by, among other factors, the wavelength of the light used. As the size of the critical dimension becomes smaller, for example below 100 nanometers or below 50 nanometers, the limits of conventional photolithography are being reached.

A minimum-size device may be produced using a spacer gate technique that uses conventional photolithography to create a structure with a sidewall on top of the gate material. A film of hardmask material, such as silicon dioxide or silicon nitride, is deposited with a certain thickness on top of the gate material and etched to create a spacer. The spacer has a width that is approximately the thickness of the hardmask film. The spacer is used to form the desired minimum-size transistor gate structure, which has a critical dimension of approximately the spacer width.

The spacer gate technique can raise delamination issues when the gate material adjacent to the spacer is etched. In particular, after the gate material is etched away, the remaining stack of gate material and hardmask spacer may have a large aspect ratio (the ratio of the height to the width of the structure). A large aspect ratio, for example a ratio of 6:1 or higher, can lead to delamination of the hardmask layer, which may result in a lower yield.

It may also be desirable to use a device having a larger critical dimension than the minimum-size device. A device having a critical dimension that is the next size larger than a minimum-size device may be called a "next-to-minimum size" device. Devices with critical dimensions larger than the minimum-size device may be created using conventional photolithography or other known techniques.

When a mix of more than one size device is needed, a spacer gate technique may be used to define minimum-size devices and classical photolithography techniques may be used to define all other gate sizes, including next-to-minimum size devices. Typically, the processing may be optimized for a spacer gate technique or classical photolithography, but it may be difficult to optimize the processing for both.

While the spacer gate technique tends to provide good critical dimension control, the associated photoresist process may not provide adequate critical dimension control. This may result in the minimum size devices having good critical dimension control but all other sizes having undesirable variations in critical dimension.

DESCRIPTION OF DRAWINGS

FIGS. 2a–11a are side views of a hardmask unit during different stages of processing in the process of FIG. 1.

FIGS. 2b–11b are top views of the hardmask unit of FIGS. 2a–11a, respectively.

Like reference symbols in the various drawings indicate like elements.

DETAILED DESCRIPTION

Figure 1A:
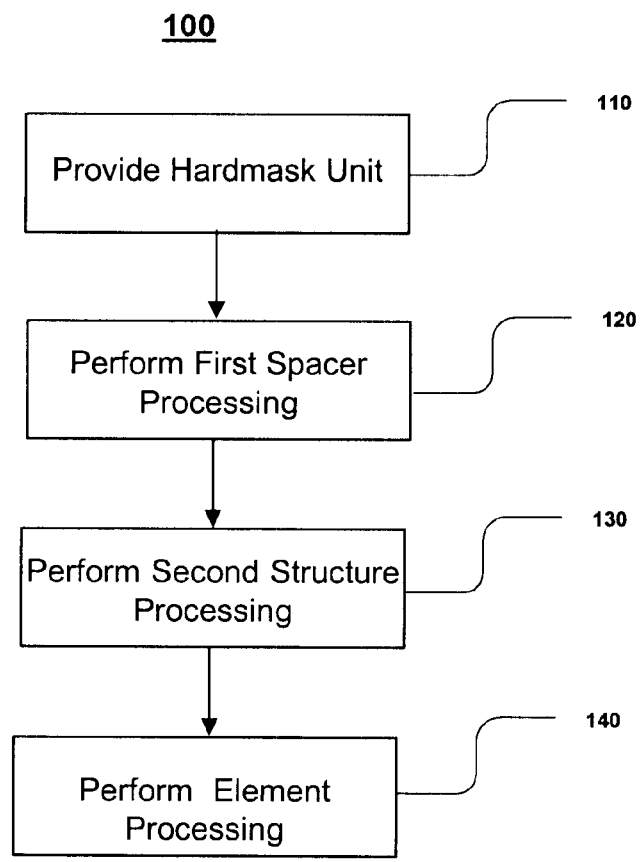
FIGS. 1a–1d are flow diagrams of a process using a hardmask unit.

FIG. 1a shows a process 100 used to make electrical devices which may be, for example, minimum size devices, next-to-minimum size devices, or other size devices. The devices may further be, for example, transistors such as MOS transistors or CMOS transistors.

Figure 2A:
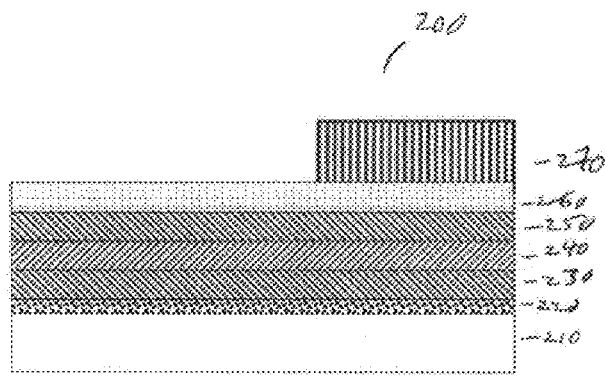

Initially, a hardmask unit is provided (110). The hardmask unit is a double gate stack, which includes a first gate layer, a first hardmask layer, a second gate layer, and a second hardmask layer. FIG. 2a shows a hardmask unit 200 that may be used in the process 100. The hardmask unit 200 has a substrate layer 210 made of a substrate material which may be a semiconductor such as, for example, silicon. For ease of discussion, a MOS transistor implementation is described though the described techniques are applicable to other implementations. The substrate may be a layer of silicon that will be doped to form the source and the drain. A protective layer 220 is formed over at least a portion of the substrate layer 210. The protective layer 220 may be made of an insulator and may be an oxide such as, for example, silicon dioxide, used to form the gate insulator.

A first gate layer 230 is formed over at least a portion of the protective layer 220. The first gate layer 230 may be made of a conductive material such as, for example, polysilicon, which may be doped to enhance conductivity. As an example, the first gate layer may be a layer of polysilicon used to form a MOS transistor gate. A first hardmask layer 240 is formed over at least a portion of the first gate layer 230. The first hardmask layer may be made of a hardmask material such as, for example, silicon dioxide or oxynitride.

A second gate layer 250 is formed over at least a portion of the first hardmask layer 240. The second gate layer 250 may be made of a material such as, for example, polysilicon. A second hardmask layer 260 is formed over at least a portion of the second gate layer 250. The second hardmask layer may be made of a hardmask material such as, for example, oxynitride or silicon dioxide. The second hardmask layer 260 should be made of a different material than the first hardmask layer 240, and there should be etch selectivity between the second hardmask layer 260 and the first hardmask layer 240. In other words, it is desirable to be able to etch one of the two hardmask layers without etching away an unacceptable amount of the other hardmask layer.

A layer of a first patterning material 270 is formed over at least a portion of the second hardmask layer 260. The first patterning material may be made, for example, of a conventional photoresist material, or may be a hardmask material different from the second hardmask layer material.

Figure 2B:
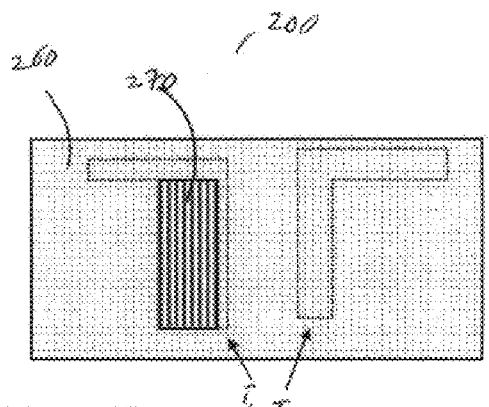

FIG. 2b illustrates a top view of the hardmask unit 200 of FIG. 2a. Only the first patterning material 270 and the second hardmask layer 260 are visible in this view. In addition, the sites of two future MOS transistors, T1 and T2, are shown. In one implementation, T1 may be a minimum-size device and T2 may be a next-to-minimum size device.

Next, referring to FIG. 1a, first spacer processing is performed (120). The first spacer processing results in the formation of a first spacer that will be used as a hardmask to make a first device such as, for example, a minimum size device.

Figure 1B:
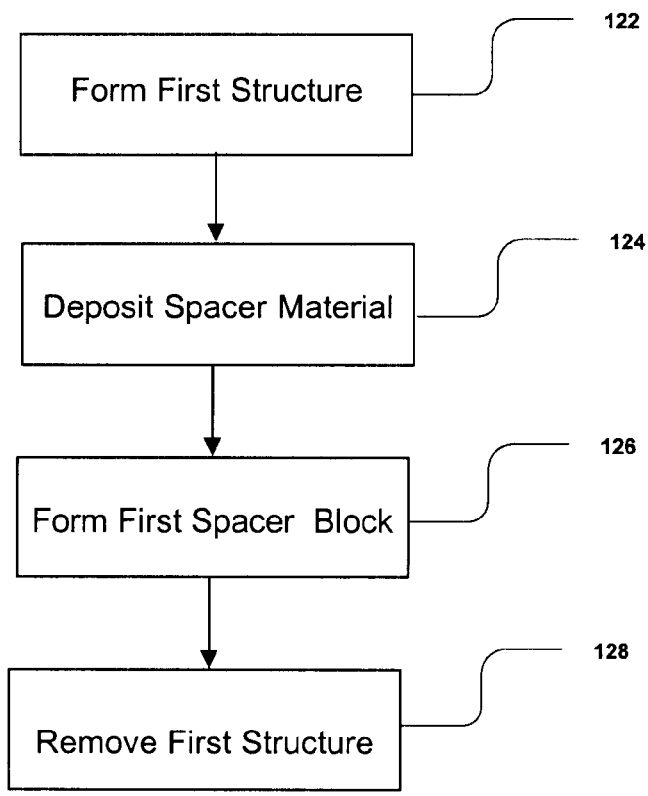
Figure 3A:
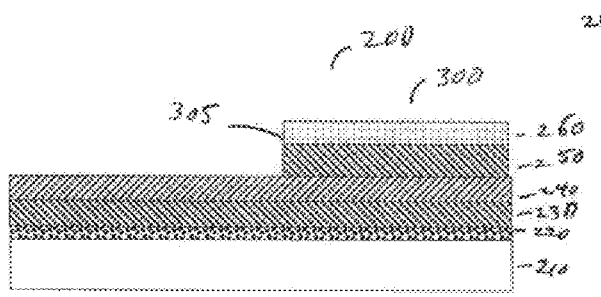

As shown in FIG. 1b, performing first spacer processing may begin with the formation of a first structure (122). The first structure provides a vertical wall against which spacer material will be deposited. FIG. 3a shows the hardmask unit 200 after processing to form a first structure 300. At the stage of processing shown in FIG. 3a, the first structure 300 is composed of a section of the second gate layer 250 and a section of the second hardmask layer 260.

The first structure 300 is formed by removing a portion of the second hardmask layer 260 and the second gate layer 250 adjacent to the first patterning material 270. This removal may be carried out using, for example, conventional photolithography and etching techniques or by other appropriate techniques. As shown in FIG. 3a, the first patterning material 270 has been removed. As also shown, the first structure 300 has a sidewall 305. Normally, it is desirable to make the sidewall 305 as close to vertical as possible.

Figure 3B:
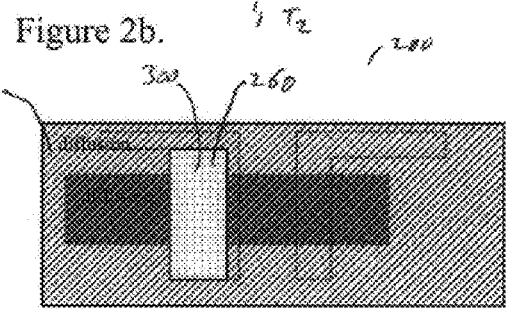

FIG. 3b shows a top view of the hardmask unit of FIG. 3a. In this view, only the second hardmask layer 260 (on top of the first structure 300) and the first hardmask layer 240 are visible. As also shown, diffusion regions 210 have been added to form the source and the drain for each of the MOS transistors.

Figure 4A:
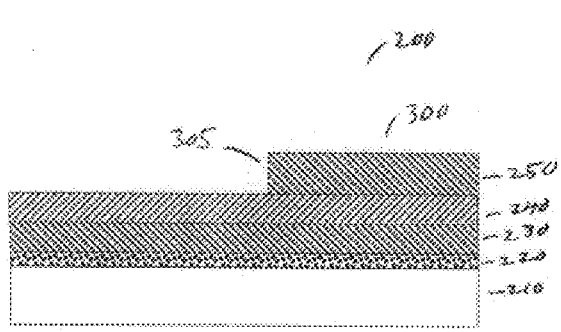
Figure 4B:
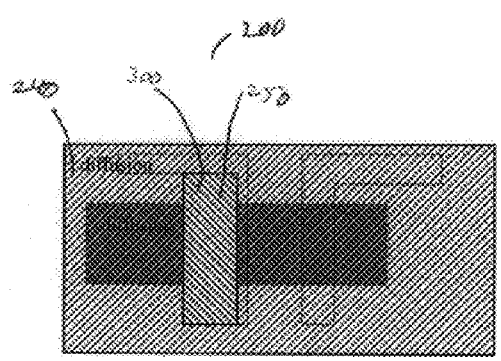

As shown in FIG. 4a, the second hardmask layer 260 is removed. The second hardmask layer 260 may be removed, for example, by etching in an acid such as phosphoric acid or by other appropriate techniques. FIG. 4b shows a top view of the hardmask unit of FIG. 4a. Only the second gate layer 250 and the first hardmask layer 240 are visible in this view.

Next, a layer of spacer material is deposited on the hardmask unit 200 in a chosen thickness (124). The thickness is substantially the same on the horizontal surface and the vertical sidewall of the first structure. FIG. 5a shows a layer of spacer material 500 deposited on the hardmask unit 200. The spacer material 500 may be, for example, a nitride film. The thickness of the spacer material 500 is substantially the same on the horizontal portion of the hardmask unit 200 and on the sidewall 305 of the first structure 300.

FIG. 5b shows a top view of the hardmask unit 200 of FIG. 5a. Only the spacer material 500 is visible.

Next, the first spacer block is formed (126). The first spacer block is made of the spacer material 500, and is used as a hardmask to define the first spacer, which in turn is used as a hardmask to define the first device.

As shown in FIG. 6a, a portion of the layer of spacer material 500 (shown in FIG. 5a) is removed to leave a first spacer block 600 adjacent to the sidewall 305 of the first structure 300. The first structure 300 is composed of a section of the second gate layer 250. The spacer material 500 may be removed by, for example, Reactive Ion Etching (RIE) or by other appropriate techniques. The first spacer block 600 acts as a hardmask for the minimum dimension lines, and is used to make a first spacer 900 as discussed below with respect to FIGS. 9a–11a and 9b–11b. The thickness of the first spacer block 600 at least partially determines the critical dimension of the minimum-size device. This approach can be used with all devices that are minimum-sized devices.

FIG. 6b shows a top view of the hardmask unit 200 of FIG. 6a. The first spacer block 600, the second gate layer 250 of the first structure 300, and the first hardmask layer 240 are visible. The first spacer block 600 is seen as a rectangular shape following the edge of the first structure 300.

Next, the first structure is removed (128). This process 120 may be used to form all devices of a certain type, such as a minimum size device.

FIG. 7a shows that the second gate layer 250 of the first structure 300 has been removed, thus removing the remaining layer of the first structure 300. The second gate layer may be selectively removed by processes such as a wet etch or a dry etch or by other appropriate techniques. The removal of the second gate layer 250 leaves the first spacer block 600 on top of the first hardmask layer 240.

FIG. 7b shows a top view of the hardmask unit 200 of FIG. 7a. The first spacer block 600 and the first hardmask layer 240 are visible. The first spacer block 600 is seen as a rectangular shape following the former location of the edge of the first structure 300.

Trim lithography is used to trim off the top horizontal portion 605, the bottom horizontal portion 610 and the left vertical portion 615 of the first spacer block 600, leaving the right vertical portion 620 of the first spacer block 600 (shown in FIG. 8b). The trim lithography may be implemented using any appropriate technique.

Referring again to FIG. 1a, second structure processing is performed (130). The second structure processing results in the formation of a second structure that is used to make a second device, such as, for example, a next-to-minimum size device. The second structure processing results in better critical dimension control for the second device because the second device is formed using a hardmask material rather than being formed using a material such as photoresist.

Figure 1C:
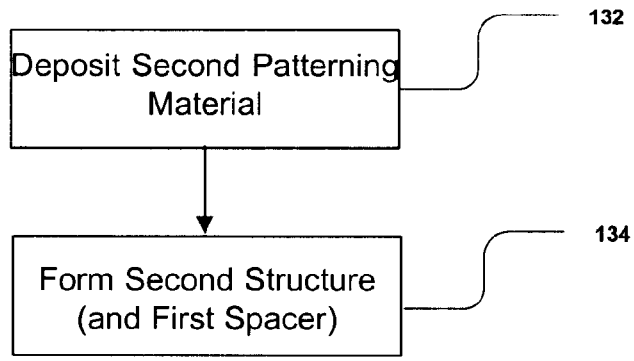

Referring to FIG. 1c, a second patterning material is deposited on the hardmask unit (132). The second pattering material is used to form the second structure, which in turn is used as a hardmask to form the second device.

As shown in FIG. 8a, a layer of a second patterning material 800 is formed over at least a portion of the first hardmask layer 240. The second patterning material 800 may be made, for example, of a conventional photoresist material, and is used in forming a second structure 910. The second structure will be used to form a second device, which may be a next-to-minimum size device. The approach used to make the second structure can be used with any device that is not a minimum-size device.

FIG. 8b illustrates a top view of the hardmask unit of FIG. 8a. The first spacer block 600, second patterning material 800, and first hardmask layer 240 are visible in this view.

Next, the second structure is formed (134) using the second patterning material as a mask. The second patterning material is then removed. FIG. 9a shows that a portion of the first hardmask layer 240 is removed adjacent to the location of the second patterning material 800 (shown in FIG. 8a), and then the second patterning material 800 is removed. The second structure 910 is composed of a section of the first hardmask layer 915. The first hardmask layer 240 may be removed later during processing (as shown in FIG. 11a) by wet etch, dry etch, or by other appropriate techniques to form the first spacer 900 and the second structure 910.

As also shown in FIG. 9a, and as discussed above with respect to process 120, a portion the first hardmask layer 240 has been removed adjacent to the first spacer block 600 to form a first spacer 900. The first spacer 900 is composed of a section of the first hardmask layer 905 and the first spacer block 600.

FIG. 9b shows a top view of the hardmask unit 200 of FIG. 9a. The first spacer block 600, the first hardmask layer 915 of the second structure 910, and the first gate layer 230 are visible in this view.

Referring again to FIG. 1a, element processing is performed (140). Element processing results in the formation from the first gate layer of elements which may be, for example, minimum size elements or next-to-minimum size elements.

Figure 1D:
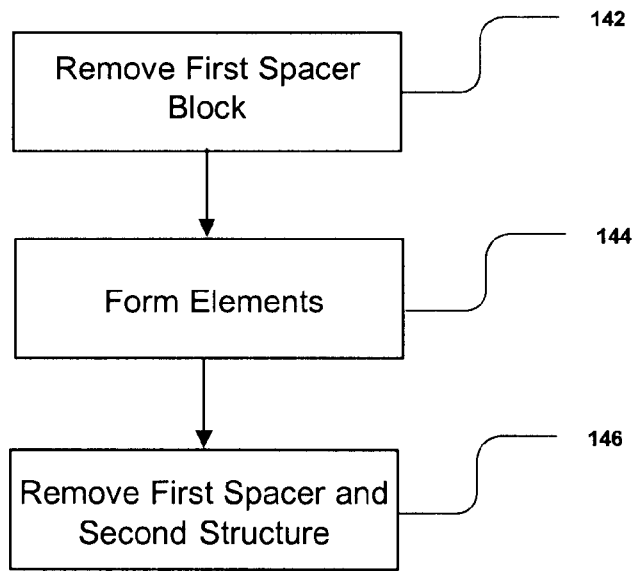

Referring to FIG. 1d, the first spacer block is removed (142), as shown in FIG. 10a. The first spacer block 600 is removed using, for example, a wet etch, such as a phosphoric acid etch, or by other appropriate techniques selective to the spacer material 500 of the first spacer block 600. This decreases the height, and consequently the aspect ratio, of the first spacer 900. Preferably, the first spacer block 600 is removed prior to etching the first gate layer 230. This allows the aspect ratio of the first spacer 900 to be reduced so as to decrease the occurrence of delamination.

Next, the elements are formed (144) by etching the first gate layer using the first spacer 900 and the second structure 910 as masks. In particular, the first spacer 900 has a section of the first hardmask layer 905, and the second structure 910 has a section of the first hardmask layer 915 that are used as masks when etching the first gate layer 230. A portion of the first gate layer is removed adjacent to the first spacer 900 to form a first element 1000, and a portion of the first gate layer 230 is removed adjacent to the second structure 910 to form a second element 1005. The first element 1000 may be used as the gate of a minimum-size device, and the second element 1005 may be used as the gate of a next-to-minimum size device.

The second structure 910, and in particular, the section of the first hardmask layer 915, was defined by the second patterning material 800. However, the second patterning material 800 was removed and the first gate layer 230 was etched using a section of the first hardmask layer 915 as a mask, instead of using the second patterning material 800 as a mask to etch the first gate layer 230. Patterning using a hardmask material is a more controllable process than patterning using a photoresist, resulting in better critical dimension control.

FIG. 10b shows a top view of the hardmask unit 200 of FIG. 10a. The section of the first hardmask layer 905 of the first spacer 900, the section of the first hardmask layer 915 of the second structure 910, and the protective layer 220 are visible.

Next, the first spacer and the second structure are removed from the hardmask unit (146), as shown in FIG. 11a. The section of the first hardmask layer 905 of the first spacer 900 and the section of the first hardmask layer 915 of the second structure 910 may be removed by using, for example, a wet etch using hydrofluoric acid, a dry etch using RIE, or other appropriate techniques. This leaves the first element 1000 and the second element 1005 on the protective layer 220. The first element 1000 may be used as the gate of a minimum-size device, and the second element 1005 may be used as the gate of a next-to-minimum size device.

FIG. 11b shows a top view of the hardmask unit 200 of FIG. 11a. The first element 1000, the second element 1005, and the protective layer 220 are visible.

A number of implementations have been described. Nevertheless, it will be understood that various modifications may be made. For example, different materials may be used for the first hardmask layer and the second hardmask layer, as long as there is sufficient etch selectivity between the first hardmask layer and the second hardmask layer. Photoresist, hardmask, or other appropriate materials and/or techniques may be used for the first patterning material and the second patterning material. Also, elements other than transistors may be fabricated using these techniques. Accordingly, other implementations are within the scope of the following claims.

What is claimed is:

1. A method of making electrical elements comprising:
    providing a hardmask unit, the hardmask unit comprising a first gate layer, a first hardmask layer formed over the first gate layer, a second gate layer formed over the first hardmask layer, and a second hardmask layer formed over the second gate layer;
    forming a first spacer for a first element on the hardmask unit, the location of the first spacer being at least partially determined by the presence of the second hardmask layer; and
    forming a second structure for a second element on the hardmask unit, the location of the second structure being at least partially determined by the presence of the first hardmask layer.

2. The method of claim 1 in which the first spacer is formed by depositing a layer of spacer material on the hardmask unit and removing a portion of the spacer material.

3. The method of claim 2 in which the spacer material comprises a nitride film.

4. The method of claim 1 in which the second hardmask layer comprises oxynitride.

5. The method of claim 1 in which the second gate layer comprises polysilicon.

6. The method of claim 1 in which the first hardmask layer comprises silicon dioxide.

7. The method of claim 1 in which the first gate layer comprises polysilicon.

8. The method of claim 1 in which the hardmask unit further comprises a substrate and a protective layer formed over the substrate, and the first gate layer is formed over the protective layer.

9. The method of claim 8 in which the protective layer comprises silicon dioxide.

10. The method of claim 8 in which the substrate comprises silicon.

11. The method of claim 1 in which the first hardmask comprises a different material than the second hardmask.

12. The method of claim 1 in which there is an etch selectivity between the first hardmask layer and the second hardmask layer.

13. The method of claim 1 in which the first element comprises a transistor gate.

14. The method of claim 13 in which the second element comprises a transistor gate.

15. The method of claim 1 in which the first element comprises a minimum-size element.

16. The method of claim 15 in which the first element comprises a transistor gate having a critical dimension smaller than 50 nanometers.

17. The method of claim 1 in which the second element comprises a next-to-minimum-size element.

18. The method of claim 17 in which the second element comprises a transistor gate having a critical dimension smaller than 50 nanometers.

19. A method of making electrical elements comprising:
    providing a hardmask unit comprising a first gate layer, a first hardmask layer formed over the first gate layer, a second gate layer formed over the first hardmask layer, and a second hardmask layer formed over the second gate layer;

forming a first structure on the hardmask unit by removing a portion of the second hardmask layer and the second gate layer from at least a portion of an area adjacent to the first structure, the first structure comprising a section of the second hardmask layer and the second gate layer;

forming a first spacer for a first element on the hardmask unit by removing the second hardmask layer from the first structure, applying a spacer material adjacent to a sidewall of the first structure, and removing the second gate layer from the first structure;

removing the first hardmask layer from at least a portion of an area adjacent to the first spacer;

removing the spacer material from the first spacer;

forming a second structure for a second element on the hardmask unit by removing a portion of the first hardmask layer;

removing the first gate layer adjacent to the first spacer; and removing the first gate layer adjacent to the second structure.

20. The method of claim 19 in which the first spacer is formed by depositing a layer of spacer material on the hardmask unit and removing a portion of the spacer material.

21. The method of claim 19 further comprising removing the first hardmask layer from the second structure.

22. The method of claim 19 further comprising removing the first hardmask layer from the first spacer.

23. The method of claim 19 in which the second hardmask layer comprises oxynitride.

24. The method of claim 19 in which the second gate layer comprises polysilicon.

25. The method of claim 19 in which the first hardmask layer comprises silicon dioxide.

26. The method of claim 19 in which the first gate layer comprises polysilicon.

27. The method of claim 19 in which the spacer material comprises a nitride film.

28. The method of claim 19 in which the hardmask unit further comprises a substrate and a protective layer formed over the substrate, and the first gate layer is formed over the protective layer.

29. The method of claim 28 in which the protective layer comprises silicon dioxide.

30. The method of claim 28 in which the substrate comprises silicon.

31. The method of claim 19 in which the first hardmask comprises a different material than the second hardmask.

32. The method of claim 19 in which there is an etch selectivity between the first hardmask layer and the second hardmask layer.

33. The method of claim 19 in which the first element comprises a transistor gate having a critical dimension smaller than 50 nanometers.

34. The method of claim 33 in which the second element comprises a transistor gate having a critical dimension smaller than 50 nanometers.

35. A method of making electrical elements comprising:

providing a hardmask unit comprising a first gate layer, a first hardmask layer formed over the first gate layer, a second gate layer formed over the first hardmask layer, and a second hardmask layer formed over the second gate layer;

removing a portion of the second hardmask layer and the second gate layer to form a first structure, the first structure comprising a section of the second hardmask layer and the second gate layer;

removing the second hardmask layer from the first structure;

depositing a layer of spacer material on the hardmask unit;

removing a portion of the layer of spacer material to form a first spacer part adjacent to a sidewall of the first structure;

removing the second gate layer from the first structure;

removing the first hardmask layer adjacent to the first spacer part;

removing the first spacer part to expose a first spacer portion of the first hardmask layer under the first spacer part;

removing a portion of the first hardmask layer to form a second structure portion of the first hardmask layer;

removing the first gate layer adjacent to the first spacer portion of the first hardmask layer;

removing the first gate layer adjacent to the second structure portion of the first hardmask layer;

removing the first hardmask layer from the first spacer portion to expose a first element, the first element comprising the first gate layer; and removing the first hardmask layer from the second structure portion to expose a second element, the second element comprising the first gate layer.

36. The method of claim 35 in which the layer of spacer material comprises a nitride film.

37. The method of claim 35 in which the second hardmask layer comprises oxynitride.

38. The method of claim 35 in which the second gate layer comprises polysilicon.

39. The method of claim 35 in which the first hardmask layer comprises silicon dioxide.

40. The method of claim 35 in which the first gate layer comprises polysilicon.

41. The method of claim 35 in which the hardmask unit further comprises a substrate and a protective layer formed over the substrate, and the first gate layer is formed over the protective layer.

42. The method of claim 35 in which there is an etch selectivity between the first hardmask layer and the second hardmask layer.

43. The method of claim 42 in which the first element comprises a transistor gate having a critical dimension smaller than 50 nanometers.

44. The method of claim 43 in which the second element comprises a transistor gate having a critical dimension smaller than 50 nanometers.

* * * * *